(12) United States Patent
Davis et al.

(10) Patent No.: US 11,901,727 B2
(45) Date of Patent: Feb. 13, 2024

(54) APPARATUSES AND METHOD FOR OVER-VOLTAGE EVENT PROTECTION

(71) Applicant: MICRON TECHNOLOGY, INC., Boise, ID (US)

(72) Inventors: James Davis, Boise, ID (US); Michael Chaine, Boise, ID (US)

(73) Assignee: Micron Technology, Inc., Boise, ID (US)

(*) Notice: Subject to any disclaimer, the term of this patent is extended or adjusted under 35 U.S.C. 154(b) by 144 days.

(21) Appl. No.: 17/525,707

(22) Filed: Nov. 12, 2021

(65) Prior Publication Data

US 2022/0069572 A1 Mar. 3, 2022

Related U.S. Application Data

(60) Division of application No. 16/223,352, filed on Dec. 18, 2018, now Pat. No. 11,183,837, which is a continuation of application No. 15/050,238, filed on Feb. 22, 2016, now Pat. No. 10,193,334, which is a continuation of application No. 13/795,425, filed on Mar. 12, 2013, now Pat. No. 9,281,682.

(51) Int. Cl.
*H02H 9/04* (2006.01)
*H01L 27/02* (2006.01)

(52) U.S. Cl.
CPC ......... *H02H 9/041* (2013.01); *H01L 27/0262* (2013.01); *H02H 9/046* (2013.01)

(58) Field of Classification Search
CPC .................................. H02H 9/04; H02H 9/05
USPC .......................................................... 361/56
See application file for complete search history.

(56) References Cited

U.S. PATENT DOCUMENTS

| | | | |
|---|---|---|---|
| 4,484,244 A | 11/1984 | Avery | |
| 4,595,941 A | 6/1986 | Avery | |
| 5,182,220 A * | 1/1993 | Ker | H01L 27/0259 257/141 |
| 5,400,202 A * | 3/1995 | Metz | H01L 27/0262 361/111 |
| 5,442,217 A | 8/1995 | Mimoto | |

(Continued)

FOREIGN PATENT DOCUMENTS

| | | |
|---|---|---|
| EP | 1355355 A3 | 9/2008 |
| GB | 2268007 | 12/1993 |

(Continued)

OTHER PUBLICATIONS

EP Office Action dated Sep. 30, 2021 for EP Appl. No. 14779499.4.
(Continued)

*Primary Examiner* — Dharti H Patel
(74) *Attorney, Agent, or Firm* — Dorsey & Whitney LLP

(57) ABSTRACT

Circuits, integrated circuits, apparatuses, and methods, such as those for protecting circuits against electrostatic discharge events are disclosed. An example apparatus comprises a thyristor coupled to a node and configured to limit the voltage and discharge the current associated with an over-voltage event at the node. The over-voltage event includes a negative voltage having a magnitude that exceeds a trigger voltage of the thyristor. The example apparatus further comprising a transistor coupled to the thyristor and configured to adjust the magnitude of the trigger voltage.

12 Claims, 3 Drawing Sheets

(56) References Cited

U.S. PATENT DOCUMENTS

| | | | |
|---|---|---|---|
| 5,521,871 A * | 5/1996 | Choi | G11C 5/145 |
| | | | 365/189.11 |
| 5,572,394 A | 11/1996 | Ker et al. | |
| 5,576,557 A * | 11/1996 | Ker | H01L 27/0259 |
| | | | 257/361 |
| 5,754,380 A | 5/1998 | Ker et al. | |
| 5,801,423 A * | 9/1998 | Manning | H01L 21/76232 |
| | | | 257/376 |
| 6,016,002 A | 1/2000 | Chen et al. | |
| 6,061,218 A | 5/2000 | Ida et al. | |
| 6,118,323 A | 9/2000 | Chaine et al. | |
| 6,268,992 B1 | 7/2001 | Lee et al. | |
| 6,462,380 B1 | 10/2002 | Duvvury et al. | |
| 6,542,346 B1 * | 4/2003 | Chen | H01L 27/0251 |
| | | | 361/111 |
| 6,560,080 B1 * | 5/2003 | Chen | H01L 27/0262 |
| | | | 361/111 |
| 6,628,488 B2 | 9/2003 | Liu et al. | |
| 6,750,515 B2 * | 6/2004 | Ker | H01L 27/1203 |
| | | | 257/338 |
| 6,809,386 B2 | 10/2004 | Chaine et al. | |
| 6,825,504 B2 * | 11/2004 | Ishizuka | H01L 27/0262 |
| | | | 257/107 |
| 6,850,397 B2 * | 2/2005 | Russ | H01L 27/0262 |
| | | | 361/91.8 |
| 6,936,896 B2 | 8/2005 | Ida et al. | |
| 6,963,112 B2 * | 11/2005 | Chen | H01L 27/0266 |
| | | | 257/365 |
| 7,106,562 B2 | 9/2006 | Kitagawa | |
| 7,473,973 B2 | 1/2009 | Kondo | |
| 7,800,128 B2 | 9/2010 | Domanski et al. | |
| 7,875,933 B2 * | 1/2011 | Schneider | H01L 29/735 |
| | | | 257/575 |
| 7,986,502 B2 | 7/2011 | Sorgeloos | |
| 8,045,304 B2 * | 10/2011 | Morishita | H01L 27/0262 |
| | | | 361/111 |
| 8,456,785 B2 * | 6/2013 | Domanski | H01L 27/0262 |
| | | | 361/118 |
| 8,611,058 B2 * | 12/2013 | Fan | H01L 27/0259 |
| | | | 361/118 |
| 8,724,268 B2 * | 5/2014 | Fan | H02H 9/046 |
| | | | 361/111 |
| 9,281,682 B2 | 3/2016 | Davis et al. | |
| 9,705,318 B2 * | 7/2017 | Chaine | H01L 27/0262 |
| 10,193,334 B2 | 1/2019 | Davis et al. | |
| 2002/0153571 A1 * | 10/2002 | Mergens | H01L 27/0262 |
| | | | 257/358 |
| 2004/0100745 A1 * | 5/2004 | Chen | H01L 27/0262 |
| | | | 361/56 |
| 2005/0275029 A1 * | 12/2005 | Watt | H01L 29/87 |
| | | | 257/355 |
| 2006/0244071 A1 | 11/2006 | Kondo | |
| 2008/0088994 A1 * | 4/2008 | Lai | H01L 27/0262 |
| | | | 361/56 |
| 2008/0180869 A1 | 7/2008 | Sugahara | |
| 2009/0122452 A1 * | 5/2009 | Okushima | H01L 27/0262 |
| | | | 361/56 |
| 2010/0172059 A1 * | 7/2010 | Chaine | H02H 9/046 |
| | | | 361/56 |
| 2011/0227127 A1 | 9/2011 | Ohta et al. | |
| 2012/0037956 A1 | 2/2012 | Song et al. | |
| 2013/0032890 A1 * | 2/2013 | Liu | H01L 27/0921 |
| | | | 257/E21.632 |
| 2013/0050886 A1 * | 2/2013 | Fan | H02H 9/046 |
| | | | 361/56 |
| 2013/0050887 A1 | 2/2013 | Fan et al. | |
| 2014/0218830 A1 * | 8/2014 | Chaine | H02H 9/046 |
| | | | 361/56 |
| 2014/0268438 A1 | 9/2014 | Davis et al. | |
| 2016/0172847 A1 | 6/2016 | Davis et al. | |
| 2019/0148934 A1 | 5/2019 | Davis et al. | |

FOREIGN PATENT DOCUMENTS

| | | |
|---|---|---|
| JP | S63-301558 | 12/1988 |
| JP | H03-234052 | 10/1991 |
| WO | 2014163935 A1 | 10/2014 |

OTHER PUBLICATIONS

First Office Action for CN Application 201480014787.5, dated Feb. 3, 2017.

International Search Report & Written Opinion for PCT/US2014/019025.

Notice of Preliminary Rejection dated Mar. 15, 2018 for Korean Application No. 10-2015-7027774.

Notice of Rejection dated Nov. 29, 2016 for JP Application No. 2016-500463.

Office Action for EP Application No. 14779499.4, dated Jul. 8, 2019.

Second Office Action dated Oct. 19, 2017 for Chinese Application No. 201480014787.5 (Engl. translation only).

Third Office Action dated Jul. 3, 2018 for Chinese application No. 201480014787.5.

European Search Report for European Patent Application No. 14779499.4 dated Jun. 3, 2016.

Notice of Preliminary Rejection dated Jul. 24, 2017 for Korean Patent Application No. 10-2015-7027774.

Receipt of first Office Action dated Jan. 17, 2017 for Korean Patent Application No. 10-2015-7027774.

Ker, et al., "ESD Protection for Deep-Submicron CMOS Technology Using Gate-Couplecmos-Trigger Lateral SCR Structure", Technical Digest of the International Electron Devices Meeting (IEDM), Dec. 10, 1995, pp. 543-546.

* cited by examiner

APPARATUSES AND METHOD FOR OVER-VOLTAGE EVENT PROTECTION

CROSS-REFERENCE TO RELATED APPLICATION

This application is a divisional of U.S. patent application Ser. No. 16/223,352 filed Dec. 18, 2018, issued as U.S. Pat. No. 11,183,837 on Nov. 23, 2021, which is a continuation of U.S. patent application Ser. No. 15/050,238 filed Feb. 22, 2016, issued as U.S. Pat. No. 10,193,334 on Jan. 29, 2019, which is a continuation of U.S. patent application Ser. No. 13/795,425, filed Mar. 12, 2013, issued as U.S. Pat. No. 9,281,682 on Mar. 8, 2016. The aforementioned applications, and issued patents, are incorporated by reference herein in their entirety and for all purposes.

TECHNICAL FIELD

Embodiments of the disclosure relate generally to integrated circuits, and more particularly, in one or more of the illustrated embodiments, to circuitry including a trigger circuit with an electrostatic discharge protection circuit.

BACKGROUND OF THE DISCLOSURE

Integrated circuits are connectable to external circuitry through input nodes, output nodes, or input/output nodes such as bond pads, input pads, input/output pins, die terminals, die pads, contact pads, and so forth. The integrated circuitry often includes operational circuitry that includes circuit components, such as transistors, that are susceptible to damage caused by over-limit electrical events, for example, voltages caused by electrostatic discharge (ESD) during handling, testing and operation of the integrated circuit. An over-limit electrical event (e.g., an ESD event) that may cause damage to the circuitry of the integrated circuit unless adequately protected. Typically, the susceptible circuit components may be protected from over-limit electrical events via an ESD protection circuit to prevent damage caused by an over-limit electrical event. Typically, an ESD protection circuit is associated with one of the above-mentioned nodes.

ESD protection circuits may include circuitry that provides a conductive path to a reference voltage such as ground and/or to a voltage supply such as VCC, to limit or clamp the voltage (e.g., by discharging or shunting the current) associated with the over-limit electrical event before operational circuitry of the integrated circuit is damaged. Although some circuit components may be capable of limiting some transient ESD voltage without damaging circuit components, other circuit components may be damaged as a result of any ESD voltage. For example, high-speed input or output circuits (or other specialized circuit components) may tolerate little to no transient ESD voltage or current. In other words, some circuits may not be self-protecting. Also, as semiconductor devices continue to shrink, the circuit components become more prone to and less tolerant of over-limit electrical events. And, even if the circuit components can tolerate a small level of transient ESD voltage or current, the ESD protection circuit's breakdown voltage may be lower than the breakdown voltage of, for example, the circuit components. In this case, dedicated ESD circuits may be added to help clamp the ESD voltage level below the breakdown voltage of the transistors.

Some dedicated ESD circuits include circuit components that exhibit a "snap-back" characteristic. Generally, a snap-back characteristic provides a trigger condition which, when exceeded, causes the circuit to enter a low-impedance state. The low-impedance state is maintained while the electrical condition on the node exceeds a minimum hold condition (e.g., minimum holding voltage and/or current levels). Examples of conventional circuits having snapback characteristics include overdriven metal-oxide-semiconductor (MOS) transistors.

In designing an adequate protection circuit using a snap-back circuit, the trigger condition must be sufficiently low to provide protection before a breakdown condition occurs for operational circuitry. Examples of conventional protection circuit for operational circuitry coupled to a negative potential node may include an ESD clamp formed using large p-type field-effect transistors (PFETs). In this case, for example, should a large negative voltage (with respect to a reference voltage, such as ground) from an over-limit electrical event be provided to the node, the transient ESD voltages may be limited and the ESD current may be discharged through the large ESD clamp to ground. However, the large ESD clamp requires a large footprint to implement. An ESD voltage protection circuit is capable of protecting the operation circuitry, yet requiring a smaller footprint is desirable.

DETAILED DESCRIPTION

Certain details are set forth below to provide a sufficient understanding of embodiments of the disclosure. However, it will be clear to one skilled in the art that embodiments of the disclosure may be practiced without these particular details. Moreover, the particular embodiments of the present disclosure described herein are provided by way of example and should not be used to limit the scope of the disclosure to these particular embodiments. In other instances, well-known circuits, control signals, timing protocols, and software operations have not been shown in detail in order to avoid unnecessarily obscuring the disclosure.

Figure 1:
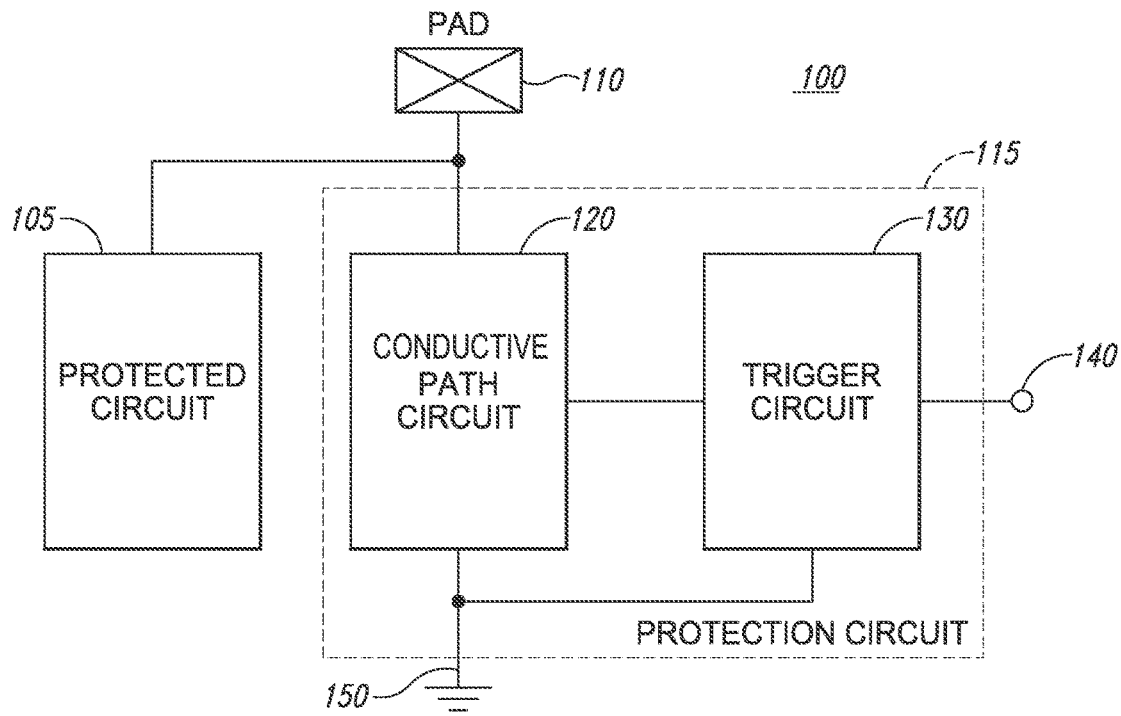
FIG. 1 is a block diagram of an exemplary apparatus including an electrostatic discharge (ESD) protection circuit according to an embodiment of the present disclosure.

FIG. 1 illustrates an apparatus including an electrostatic discharge (ESD) protection circuit according to an embodiment of the disclosure. As used herein, examples of apparatuses may include an integrated circuit, a memory device, a memory system, an electronic device or system, a smart phone, a tablet, a computer, a server, etc. The apparatus 100 may include a protected circuit 105, and a protection circuit 115. The protection circuit 115 may be coupled to a pad 110 in parallel with the protected circuit 105.

The protection circuit 115 may be configured to help protect the protected circuit 105 from harmful events. For example, the protection circuit 115 may help protect electrical components of the protected circuit 105 from being damaged by over-limit electrical events (such as an over-voltage event), for example, electrostatic discharge (ESD), or electrical noise events. Although over-limit electrical events or other noise may come from any source within the integrated circuit, it may also come from an external source via the pad 110 or other external node. For example if a user, or a metallic part or any other object touches the pad 110, that contact may induce an over-limit electrical event. The protection circuit 115 may help limit (e.g., clamp) the voltage and discharge the current associated with the over-limit electrical or other event to a reference node 150. In some embodiments, the protection circuit may limit the voltage associated with the over-limit electrical or other event by discharging a current associated with the over-limit electrical or other event to a reference node 150. The protection circuit 115 may further help limit (e.g., clamp) the voltage.

The protection circuit 115 may include a conductive path circuit 120 and a trigger circuit 130. The conductive path circuit 120 may provide a current discharge path between the pad 110 and the reference node 150. The conductive path circuit 120 may at least partially discharge an electrical condition by discharging current between the pad 110 and the reference node 150 responsive to a voltage difference between the pad 110 and the reference node 150 exceeding a magnitude of a trigger voltage of the conductive path circuit 120. The trigger circuit 130 may be configured to adjust the trigger voltage of the conductive path circuit 120 based on a value of the control node 140. For example, responsive to the control node 140 having a first value, the trigger circuit 130 may cause the conductive path circuit 120 to have a first trigger voltage. Further, responsive to the control node 140 having a second value, the trigger circuit 130 may cause the conductive path circuit 120 to have a second trigger voltage. In some embodiments, a voltage of the control node 140 may be modulated such that the voltage of the control node 140 has the first value while the apparatus 100 is in an operational mode, and may have the second value while the apparatus 100 is in an ESD mode. In some embodiments, the first value of the control node 140 may be set to a VCC voltage and the second value of the control node 140 may be a reference voltage, such as ground.

In some embodiments, the pad 110 may be a negative voltage node while the apparatus is in an operational mode, and the conductive path circuit 120 may be configured to provide a negative discharge path between the reference node 150 and the pad 110. The conductive path circuit 120 may include a thyristor (e.g., a silicon-controlled rectifier (SCR)) configured to, responsive to a magnitude of a voltage difference between the pad 110 and the reference node 150 exceeding (e.g., is more negative than) the trigger voltage, provide a conductive path between the pad 110 and the reference node 150. The conductive path may be used to discharge an electrical current provided to the pad 110. The conductive path circuit 120 may continue to discharge the current through the conductive path circuit while in a holding condition (e.g., until a magnitude of a voltage differential between the pad 110 and the reference node 150 is reduced to less than a holding voltage of the conductive path circuit 120).

In some embodiments, the trigger circuit 130 may include a p-type FET (PFET) configured to adjust the trigger voltage of the conductive path circuit 120 based on a state of the PFET. For example, while the PFET is in a first state, the conductive path circuit 120 has a first trigger voltage and while the PFET is in a second state, the conductive path circuit 120 has a second trigger voltage. The state of the PFET may be controlled responsive to a value (e.g., voltage) of the control node 140. The PFET may be coupled in parallel with the conductive path circuit 120, with a gate of the PFET coupled to the control node 140. Although FIG. 1 illustrates the protected circuit 105 in parallel with the protection circuit 115, a protection circuit may also be placed in series with the protected circuit or even merged with the protected circuit. In some embodiments, the conductive path circuit 120 may include additional circuitry configured to discharge electrical currents provided to the pad 110 responsive to a positive ESD or other noise event.

Figure 2:
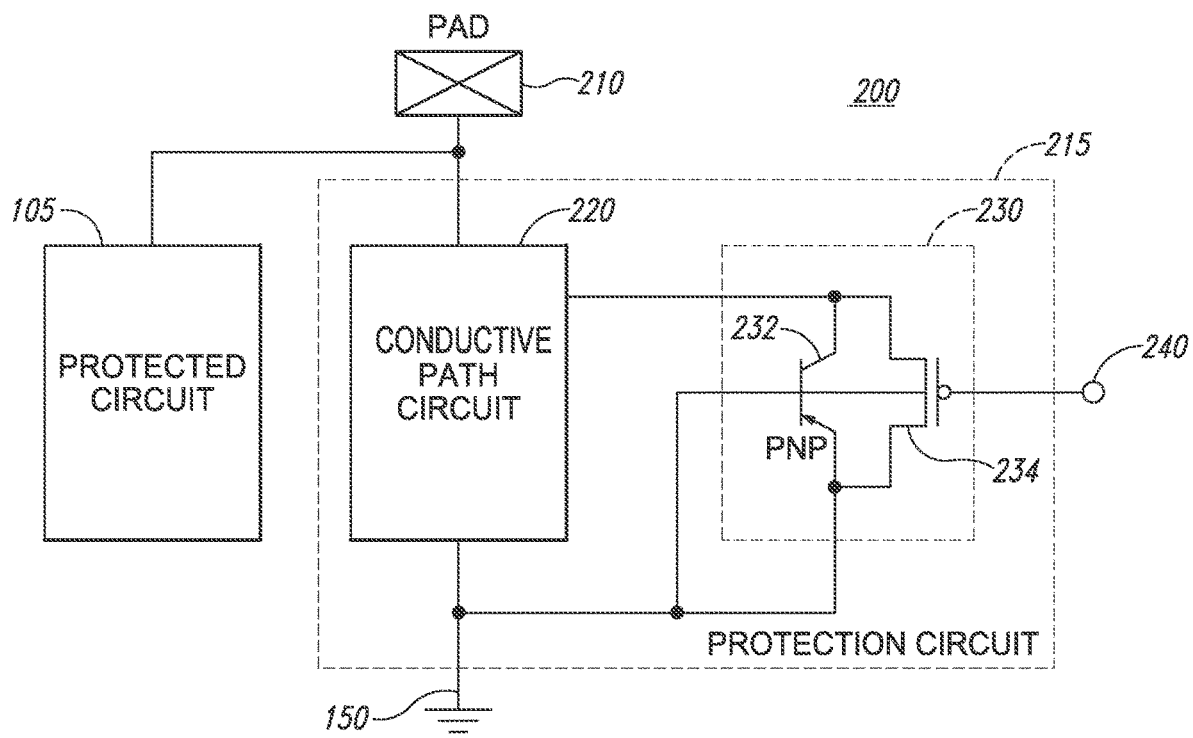
FIG. 2 is a block diagram of an exemplary apparatus including an ESD protection circuit according to an embodiment of the present disclosure.

FIG. 2 illustrates an apparatus 200 according to an embodiment of the disclosure. The apparatus 200 includes a protected circuit 105 and a protection circuit 215. The protected circuit 105 is similar to that shown in FIG. 1. The protection circuit 215 may be coupled to a pad 210 in parallel with the protected circuit 105. The protection circuit 215 may include a conductive path circuit 220 coupled in parallel with a trigger circuit 230. The trigger circuit 230 may include a trigger bipolar junction transistor (BJT) 232 and a trigger transistor 234.

In some embodiments, the trigger circuit 230 includes the trigger BJT 232 merged with the trigger transistor 234. The trigger BJT 232 is "merged" with the trigger transistor 234 in that the body of the trigger transistor 234 shares an n-well with at least a portion of the trigger BJT 232, as will be described further in FIG. 4. Returning to FIG. 2, however, the trigger circuit 230 may be visualized as including the trigger BJT 232 and the trigger transistor 234. The trigger BJT 232 may be a lateral p-n-p type BJT, with an emitter and a base coupled to the reference node 150, and a collector coupled to the conductive path circuit 220. In some embodiments, the trigger transistor 234 may be a PFET with a source coupled to the reference node 150, a source coupled to the conductive path circuit 220, and a gate coupled to the control node 240.

In operation, the protection circuit 215 may help protect the protected circuit 105 by limiting the voltage and discharging at least some current resulting from an over-limit electrical event (or other noise event) rather than having the protected circuit 105 manage that current and voltage. For example, the protection circuit 215 may be configured to limit the voltage (e.g., by discharging a current) from the reference node 150 to the pad 210 via the conductive path circuit 220, responsive to a negative (e.g., relative to a voltage of the reference node 150) voltage provided to the pad 210 exceeding a trigger voltage. The trigger voltage may be adjusted based on a state of the trigger transistor 234. The state of the trigger transistor 234 may be controlled based on a value of the control node 240. For example, the trigger voltage set by the trigger transistor 234 may be greater when a voltage of the control node 240 exceeds a threshold voltage of the trigger transistor 234 (e.g., the trigger transistor 234 is in a first state) than when the voltage of the control node 240 is less than a threshold voltage of the trigger transistor 234 (e.g., the trigger transistor 234 is in a second state). In some embodiments, the trigger transistor 234 may be in the first state (e.g., the voltage of the control node 240 is greater than the threshold voltage of the trigger transistor 234) while the apparatus 200 is in an operational mode and the trigger transistor 234 may be in the second state (e.g., the voltage of the control node 240 is less than the threshold voltage of the trigger transistor 234) while the apparatus 200 is in an ESD mode. The protection circuit 215 including the trigger circuit 230 having the trigger transistor 234 to adjust the trigger voltage of the conductive path circuit 220 may have a smaller footprint as compared with conventional ESD protection circuits that include large PFETs.

Figure 3:
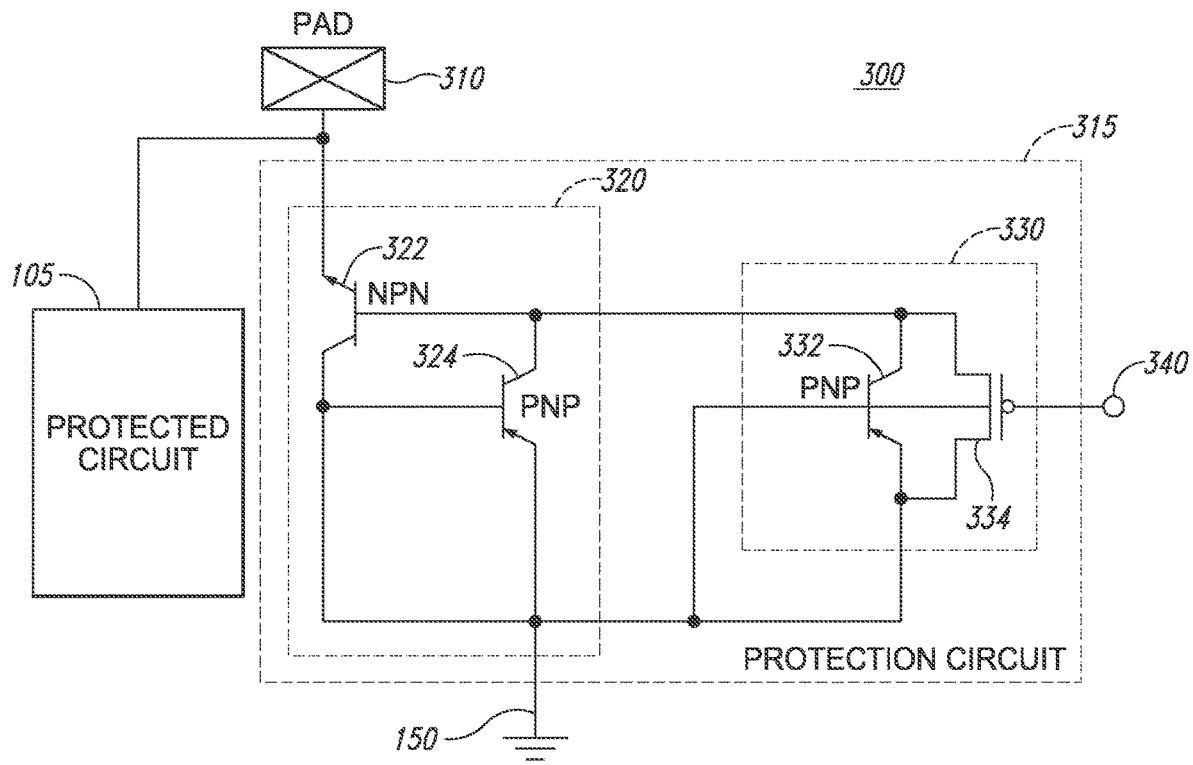
FIG. 3 is a block diagram of an exemplary apparatus including an ESD protection circuit according to an embodiment of the present disclosure.

FIG. 3 illustrates an apparatus 300 according to an embodiment of the disclosure. The apparatus 300 includes a protected circuit 105 and a protection circuit 315. The protected circuit 105 is similar to that shown in FIGS. 1 and 2. The protection circuit 315 may be coupled to a pad 310 in parallel with the protected circuit 105. The protection circuit 315 may include a conductive path circuit 320 coupled in parallel with a trigger circuit 330. The trigger circuit 330 may include a trigger transistor 334 and a trigger BJT 332. In some embodiments, the trigger circuit 330 includes the trigger BJT 332 merged with the trigger transistor 334. In some embodiments, the trigger BJT 332 may be a lateral p-n-p type BJT, with an emitter and a base coupled to the reference node 150, and a collector coupled to the conductive path circuit 320. In some embodiments, the trigger transistor 334 may be a PFET with a drain coupled to the reference node 150, a source coupled to the conductive path circuit 320, and a gate coupled to the control node 340. The protection circuit 315 may correspond to the protection circuit 115 of FIG. 1 and the protection circuit 215 of FIG. 2. The conductive path circuit 320 may be a negative direction (e.g., from the reference node 150 to the pad 310) SCR having a trigger voltage controlled by the trigger circuit 330.

The conductive path circuit 320 includes a negative direction SCR coupled between the pad 310 and a reference node 150. The SCR is represented in FIG. 3 as a first BJT 322 and a second BJT 324. The first BJT 322 may be an n-p-n type BJT and the second BJT 324 may be p-n-p type BJT, and as will be described in more detail below, may share a p-type base-collector region and sharing an n-type collector-base region. The conductive path circuit 320 may be configured to limit voltage between the reference node 150 and the pad 310 (e.g., by discharging a current) responsive to a magnitude of voltage differential between the pad 310 and the reference node 150 exceeding (e.g., being more negative than) a trigger voltage. The trigger circuit 330 may be configured to adjust the trigger voltage of the conductive path circuit 320. For example, the trigger voltage of the conductive path circuit 320 based on state of a trigger transistor 334 of the trigger circuit 330.

Figure 4:
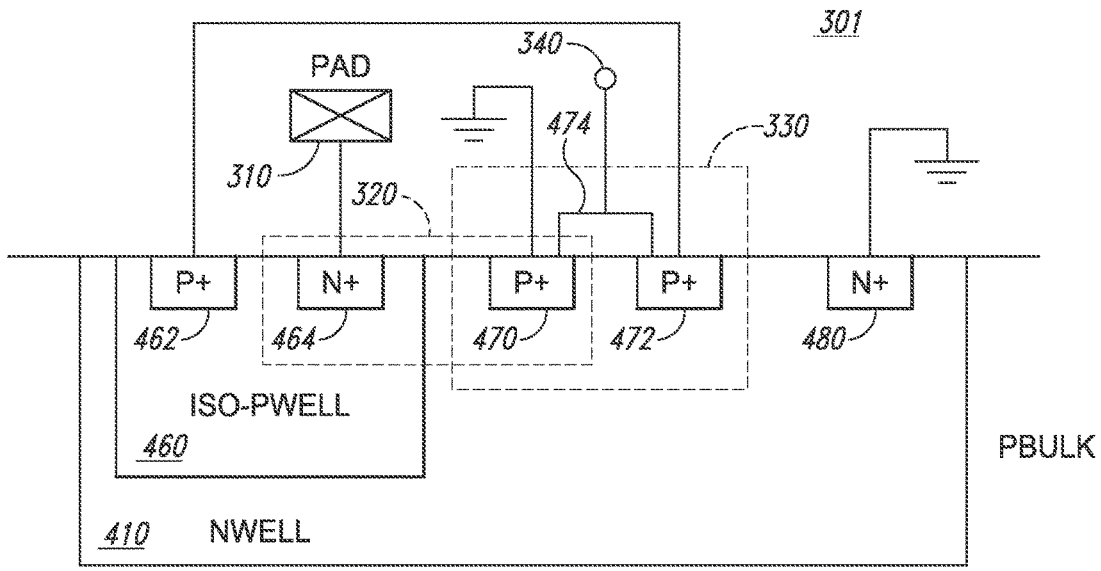
FIG. 4 is a cross-sectional diagram of an integrated circuit implementing the ESD protection circuit of FIG. 3 according to an embodiment of the disclosure.

Although FIG. 3 illustrates the first BJT 322 and the second BJT 324 as separate devices, as illustrated in FIG. 4 and discussed below, the first BJT 322 and the second BJT 324 may not be separate devices but rather may share doped regions and, thus, form an n-p-n-p type thyristor, rather than form two distinct BJTs. For example, the base of the first BJT 322 may share the same doped region (e.g., an isolated p-well ISO-PWELL 460 of FIG. 4) as a collector of the second BJT 324, and a collector of the first BJT 322 may share the same doped region (e.g., an n-well NWELL 410 of FIG. 4) as a base of the second BJT 324. Returning to FIG. 3, however, the SCR of the conductive path circuit 320 may be visualized as including the first BJT 322 and the second BJT 324.

Further, although FIG. 3 illustrates the trigger BJT 332 and the trigger transistor 334 as separate devices, as illustrated in FIG. 4 and discussed below, the trigger BJT 332 and the trigger transistor 334 may not be separate but rather may share doped regions. For example, a collector of the trigger BJT 332 may share the same doped region (e.g., a p+ region 470 of FIG. 4) as a source of the trigger transistor 334, and an emitter of the trigger BJT 332 may share the same doped region (e.g., a p+ region 472 of FIG. 4) as a drain of the trigger transistor 334. Additionally, a base of the trigger BJT 332 may share the same doped region (e.g., the NWELL 410 of FIG. 4) as a body of the trigger transistor 334.

In operation, the conductive path circuit 320 provides a conductive path between the reference node 150 and the pad 310 responsive to a voltage differential between the pad 310 and the reference node 150 exceeding (e.g., being more negative than) a trigger voltage. As known, SCRs exhibit a "snapback" current-voltage relationship when triggered. The snapback characteristics of the SCR of the conductive path circuit 320 are advantageously used to protect the protected circuit 105. The trigger transistor 334 of the trigger circuit 330 may be configured to effectively adjust the trigger voltage for the conductive path circuit 320 through gate modulation. For example, the control node 340 may have a first voltage. Responsive to the control node 340 having the first voltage, the trigger transistor 334 may be in a first state. Responsive to the trigger transistor 334 being in the first state, the conductive path circuit 320 may have a first trigger voltage. Further, the control node 340 may have a second voltage. Responsive to the control node 340 having the second voltage, the trigger transistor 334 may be in a second state. Responsive to the trigger transistor 334 being in the second state, the conductive path circuit 320 may have a second trigger voltage. As a result of the conductive path circuit 320 having either the first trigger voltage or the second trigger voltage, the conductive path circuit 320 may trigger at a sufficiently low voltage to discharge current resulting from an over-limit electrical event and to further clamp a voltage protected circuit 105 to a low enough voltage to prevent the protected circuit 105 from being damaged by the over-limit electrical event.

FIG. 4 illustrates a apparatus 301 depicting a cross-section view of the protection circuit 315 of FIG. 3 according to an embodiment of the disclosure implemented an isolated p-well ISO-PWELL 460 within an n-well NWELL 410. The NWELL 410 is doped with an n-type dopant and the ISO-PWELL 460 is doped with a p-type dopant.

As explained above, although FIG. 3 illustrates the first BJT 322 and the second BJT 324 of the conductive path circuit 330 as separate devices, as illustrated in FIG. 4, the first BJT 322 and the second BJT 324 may not be separate but rather may share doped regions. Referring to FIG. 4, the first BJT 322 (of FIG. 3) of the conductive path circuit 320 includes an n+ region 464 (e.g., the emitter) coupled to the pad 310, the ISO-PWELL 460 (e.g., the base), and the NWELL 410 (e.g., the collector) coupled to the reference node 150 via the n+ region 480. Further, the second BJT 324 (of FIG. 3) of the conductive path circuit 320 includes the ISO-PWELL 460 (e.g., the collector), the NWELL 410 (e.g., the base), which is shared with the base of the trigger BJT 332, and a p+ region 470 (e.g., the emitter) coupled to the reference node 150, which is shared with the collector of the trigger BJT 332. Thus, the conductive path circuit 320 may be a single p-n-p-n device (e.g., a p (p+ region 470)-n (NWELL 410)-p (ISO-PWELL 460)-n (464) device).

Further, as explained above, although FIG. 3 illustrates the trigger BJT 332 and the trigger transistor 334 as separate devices, as illustrated in FIG. 4, the trigger BJT 332 and the trigger transistor 334 of the trigger circuit 330 may share doped regions. Referring to FIG. 4, the trigger BJT 332 (of FIG. 3) of the trigger circuit 330 includes the p+ region 470 (e.g., the emitter) coupled to the reference node 150, the NWELL 410 (e.g., the base) coupled to the reference node 150 via the n+ region 480, and the p+ region 472 (e.g., the collector). Further, the trigger transistor 334 of the trigger circuit 330 includes the p+ region 470 (e.g., the drain), which is shared with the emitter of the trigger BJT 332, a gate 474 (e.g., the gate) coupled to the control node 340, a p+ region 472 (e.g., the source), which is shared with the collector of the trigger BJT 332, and the NWELL 410 (e.g., the body), which is shared with the base of the trigger BJT 332. Thus, the trigger circuit 330 may be a single p-n-p device with a gate (e.g., a p (p+ region 470)-n (NWELL 410)-p (p+ region 472) device with a gate 474. The p+ region 472 may be coupled to the ISO-PWELL 460 via the p+ region 462.

In operation, the trigger circuit 330 of the apparatus 301 may be configured to adjust a trigger voltage of the apparatus 301 based on a voltage of the control node 340. Responsive to a negative voltage differential between the pad 310 and the reference node 150 exceeding (e.g., being more negative than) the trigger voltage (e.g., responsive to an over-limit electrical event or other noise event), the conductive path circuit 320 may provide a conductive path between the reference node 150 and the pad 310. The trigger circuit 330 is configured to adjust a voltage of the ISO-PWELL 460 based on a state of the trigger circuit 330, which adjusts the trigger voltage of the trigger circuit 330. The state of the trigger circuit 330 is controlled responsive to a voltage of the control node 340. For example, responsive to the control node 340 having a first voltage, the trigger circuit 330 is in a first state. Based on the trigger circuit 330 being in the first state, the conductive path circuit 320 has a first trigger voltage. Further, responsive to the control node 340 having a second voltage, the trigger circuit 330 is in a second state. Based on the trigger circuit 330 being in the second state, the conductive path circuit 320 has a second trigger voltage. In embodiment, the first mode is an operational mode and the second mode is ESD protection mode. In some examples, the first voltage of the control node 340 is greater than the second voltage of the control node 340, and the first trigger voltage of the conductive path circuit 320 is greater than the second trigger voltage of the conductive path circuit 320. For example, during an operational mode, a negative operational voltage (e.g., 0 to −4.1 volts) is expected at the pad 310. Thus, the trigger voltage should be lowered to a voltage that is more negative than the expected negative operational voltage at the pad 310 to avoid interfering with operation of the protected circuit 105, yet providing protection to the protected circuit 105 from damaging voltages at the pad 310. Further, while in an ESD mode, little or no voltage is expected at the pad 310. Thus, the trigger voltage may be set to a value that is less negative than the trigger voltage used during the operational mode to prevent the pad 310 from building a charge.

Figure 5:
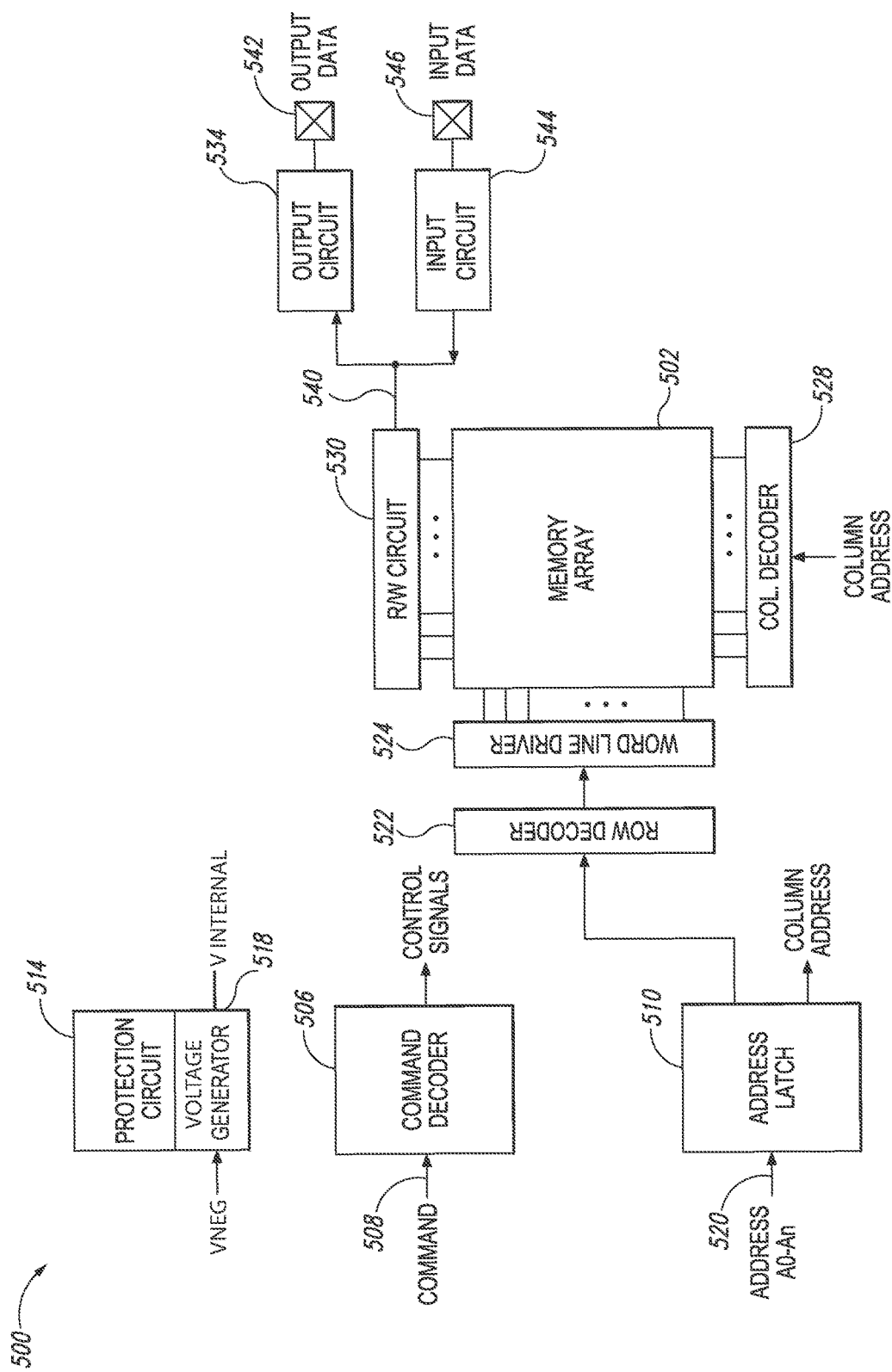
FIG. 5 is a schematic diagram of a memory including an ESD protection circuit according to an embodiment of the disclosure.

FIG. 5 illustrates a portion of a memory 500 according to an embodiment of the present disclosure. The memory 500 includes an array 502 of memory cells, which may be, for example, DRAM memory cells, SRAM memory cells, flash memory cells, phase change memory cells, or some other types of memory cells. The memory 500 includes a command decoder 506 that receives memory commands through a command bus 508 and generates corresponding control signals within the memory 500 to carry out various memory operations. Row and column address signals are applied to the memory 500 through an address bus 520 and provided to an address latch 510. The address latch then outputs a separate column address and a separate row address.

The row and column addresses are provided by the address latch 510 to a row decoder 522 and a column address decoder 528, respectively. The column address decoder 528 selects bit lines extending through the array 502 corresponding to respective column addresses. The row decoder 522 is connected to word line driver 524 that activates respective rows of memory cells in the array 502 corresponding to received row addresses. The selected data line (e.g., a bit line or bit lines) corresponding to a received column address are coupled to a read/write circuit 530 to provide read data to a data output circuit 534 via an input-output data bus 540. An output pad 542 coupled to the data output circuit 534 is used for electrically coupling to the memory 500. Write data are applied to the memory array 502 through a data input circuit 544 and the memory array read/write circuitry 530. An input pad 546 coupled to the data input circuit 542 is used for electrically coupling to the memory 500. The command decoder 506 responds to memory commands applied to the command bus 508 to perform various operations on the memory array 502. In particular, the command decoder 506 is used to generate internal control signals to read data from and write data to the memory array 502.

In some embodiments, the memory 500 may also include a voltage generator 518 configured to receive a negative input voltage VNEG and to provide an internal voltage VINTERNAL. The voltage generator 518 may be coupled to a protection circuit 514, such as an SCR. The protection circuit 514 may help protect circuitry of the memory 500 in the event a relatively high VNEG voltage is provided to the voltage generator, such as from an over-limit electrical event. Additionally, as previously discussed, the protection circuit 514 may allow for modulating the trigger conditions for the SCRs included in the protection circuit 514. In some embodiments, the protection circuit 514 can be used in power-up sequences for the memory 500, as previously discussed. That is, while no power is applied to the memory 500, the trigger conditions for the protection circuit 514 are relatively low. In contrast, during power up, or after power has been applied to the memory 500, the trigger conditions for the protection circuits 514 are modulated to a higher trigger condition relative to when no power is applied.

From the foregoing it will be appreciated that, although specific embodiments of the disclosure have been described herein for purposes of illustration, various modifications may be made without deviating from the spirit and scope of the disclosure. For example, the protection circuit 514 may include the protection circuit 115 of FIG. 1, the protection circuit 215 of FIG. 2, the protection circuit 315 of FIG. 3, the conductive path circuit 320 and the trigger circuit 330 of FIG. 4, or any combination thereof. However, the protection circuit 514 is not limited to having the same design, and may be of different designs and include different circuitry from one another. For example, in some embodiments the protection circuit 315 of FIG. 3 may be configured to protect against a negative over-limit electrical event, while another protection circuit include circuitry configured to protect against a positive over-limit electrical event. Accordingly, the disclosure is not limited except as by the appended claims.

Various illustrative components, blocks, configurations, modules, circuits, and steps have been described above generally in terms of their functionality. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as previously described.

What is claimed is:

1. An apparatus comprising:
    a bulk material doped with a first dopant type, wherein the bulk material includes a first well doped with a second dopant type, wherein the first well includes a first region, a second region, and a second well doped with the second dopant type, wherein the second well includes a third region doped with the first dopant type, wherein the third region, the second well, the first well, and the second region together form a thyristor, wherein the first region and the first well are coupled to a reference node, wherein the third region is coupled to a pad configured to provide an input signal; and
    a gate formed on a surface of the bulk material overlapping an area between the first region and the second region, wherein the gate is coupled to a trigger voltage source configured to set the trigger voltage of the thyristor.

2. The apparatus of claim 1, wherein the first dopant type is a p-type dopant and the second dopant type is an n-type dopant.

3. The apparatus of claim 1, wherein the second well is connected to the second region via a conductor.

4. The apparatus of claim 1, wherein the third region, the second well, and the first well together form a first bipolar junction transistor (BJT) of the thyristor.

5. The apparatus of claim 4, wherein the second well, the first well, and the second region together form a second BJT of the thyristor.

6. The apparatus of claim 1, wherein the first well, the first region, the second region, and the second well are configured to protect against electrostatic discharge.

7. An apparatus comprising:
    a first well formed with a first dopant type, wherein the first well includes a first region, a second region, and a second well doped with a second dopant type, wherein the second well includes a third region doped with the second dopant type, wherein the third region, the second well, the first well, and the second region together form a thyristor, wherein the first region and the first well are coupled to a reference node, wherein the third region is coupled to a pad configured to provide an input signal; and
    a gate overlapping an area between the first region and the second region, wherein the gate is coupled to a trigger voltage source configured to set the trigger voltage of the thyristor.

8. The apparatus of claim 7, wherein the first dopant type is an n-type dopant and the second dopant type is an n-type dopant.

9. The apparatus of claim 7, wherein the second well is connected to the second region via a conductor.

10. The apparatus of claim 7, wherein the third region, the second well, and the first well together form a first bi-polar junction transistor (BJT) of the thyristor.

11. The apparatus of claim 10, wherein the second well, the first well, and the second region together form a second BJT of the thyristor.

12. The apparatus of claim 7, wherein the first well, the first region, the second region, and the second well are configured to protect against electrostatic discharge.

* * * * *